(12) United States Patent
Götzen

(10) Patent No.: US 9,236,665 B2
(45) Date of Patent: Jan. 12, 2016

(54) CONDUCTOR TRACK UNIT FOR A MOTOR VEHICLE

(75) Inventor: Klaus Götzen, Mülheim (DE)

(73) Assignee: Kiekert Aktiengesellschaft, Heiligenhaus (DE)

(*) Notice: Subject to any disclaimer, the term of this patent is extended or adjusted under 35 U.S.C. 154(b) by 17 days.

(21) Appl. No.: 14/342,880

(22) PCT Filed: Sep. 1, 2012

(86) PCT No.: PCT/DE2012/000879
§ 371 (c)(1),
(2), (4) Date: Mar. 19, 2014

(87) PCT Pub. No.: WO2013/034128
PCT Pub. Date: Mar. 14, 2013

(65) Prior Publication Data
US 2014/0190745 A1 Jul. 10, 2014

(30) Foreign Application Priority Data
Sep. 5, 2011 (DE) .......... 10 2011 082 140

(51) Int. Cl.
*H01R 4/10* (2006.01)
*H05K 3/40* (2006.01)
(Continued)

(52) U.S. Cl.
CPC *H01R 4/10* (2013.01); *E05B 81/54* (2013.01); *E05B 85/02* (2013.01); *H01R 12/55* (2013.01); *H05K 3/4015* (2013.01); *E05B 81/06* (2013.01); *H05K 1/0256* (2013.01); *H05K 3/202* (2013.01);
(Continued)

(58) Field of Classification Search
USPC ............. 439/214, 110, 111, 891, 877, 876
See application file for complete search history.

(56) References Cited

U.S. PATENT DOCUMENTS 3,719,578 A * 3/1973 Berthoux et al. ............. 204/252
4,184,730 A * 1/1980 Huebner ......................... 439/79
(Continued)

FOREIGN PATENT DOCUMENTS

DE 27 23 201 A1 11/1978
EP 0 260 681 A2 3/1988

OTHER PUBLICATIONS

International Search Report for corresponding patent application No. PCT/DE2012/000879 dated Feb. 22, 2013.

*Primary Examiner* — Alexander Gilman
(74) *Attorney, Agent, or Firm* — Renner, Otto, Boisselle & Sklar, LLP

(57) ABSTRACT

The invention relates to a conductor track unit, in particular for a motor vehicle. The conductor track unit is provided with conductor tracks which are embedded in an electrically insulating material. The conductor tracks are, in particular completely, surrounded by the electrically insulating material and are therefore not accessible from the outside. Electrical connections are electrically connected to the conductor tracks. The electrical connections are accessible from the outside, and therefore can be electrically connected to electrical contacts of electrical or electronic components such as a switch, detector, electronic radio component, integrated circuit, electronic chip, electronic control device or motor, for example by soldering. The conductor tracks and electrical connections are different components which are therefore initially independent of one another and can be produced independently dependently of one another. A particularly robust yet delicate conductor track unit can be provided in this way.

10 Claims, 4 Drawing Sheets

Figure 1:
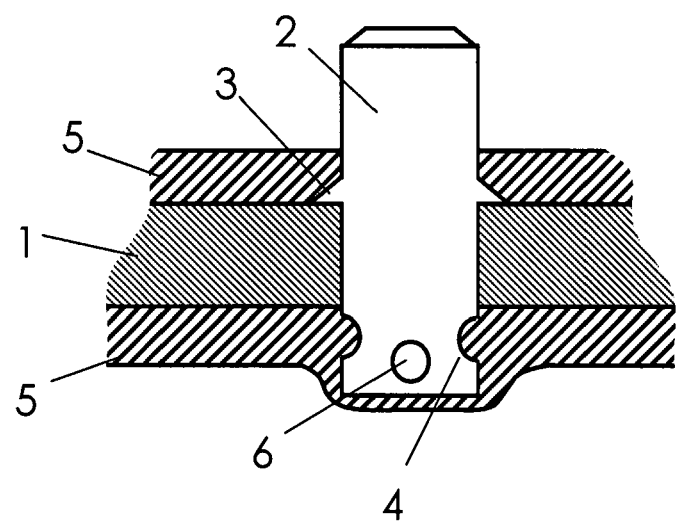

(51) Int. Cl.
  *H01R 12/55* (2011.01)
  *E05B 85/02* (2014.01)
  *E05B 81/54* (2014.01)
  *H05K 1/02* (2006.01)
  *H05K 3/20* (2006.01)
  *H05K 3/30* (2006.01)
  *H05K 3/34* (2006.01)
  *E05B 81/06* (2014.01)

(52) U.S. Cl.
  CPC ............. *H05K 3/308* (2013.01); *H05K 3/3426* (2013.01); *H05K 2201/1009* (2013.01); *H05K 2201/10242* (2013.01); *H05K 2201/2072* (2013.01)

(56) References Cited

U.S. PATENT DOCUMENTS

| | | | | |
|---|---|---|---|---|
| 5,664,953 | A * | 9/1997 | Reylek | 439/111 |
| 6,129,560 | A * | 10/2000 | Baur et al. | 439/76.1 |
| 6,264,510 | B1 * | 7/2001 | Onizuka et al. | 439/876 |
| 6,445,571 | B1 * | 9/2002 | Inniss et al. | 361/624 |
| 6,741,453 | B1 * | 5/2004 | Aleardi et al. | 361/640 |
| 6,790,059 | B2 * | 9/2004 | Poehlau | 439/110 |
| 7,607,924 | B2 * | 10/2009 | Yanai et al. | 439/76.2 |
| 2004/0048524 | A1 * | 3/2004 | Yuasa et al. | 439/891 |
| 2010/0065962 | A1 | 3/2010 | Bayerer et al. | |

\* cited by examiner

CONDUCTOR TRACK UNIT FOR A MOTOR VEHICLE

The invention relates to a conductor track unit, in particular for a motor vehicle with conductor tracks that are at least partially embedded in an electrically insulating material and electrical connections connected to the conductor tracks that are accessible.

Electrical or electronic components such as switches, detectors or electric motors are connected to the electrical connections of such a conductor track unit. Such electronic components are, for instance, located in a lock and, in particular, in a door lock of motor vehicles. A lock for motor vehicles as disclosed in the invention generally contains a rotary catch and at least one pawl with which a rotation of the rotary catch in opening direction can be blocked.

Document DE 10 2005 049 975 A1 discloses a conductor track unit containing conductor tracks punched out of tin plate. The conductor tracks lead out of a base element. Such a base element generally consists of an electrically isolated material and, in particular, plastic. Parts of the conductor track leading out of the base element are electrically connections accessible from the outside. Electric or electronic components can be connected to these.

Document EP 1 231 824 A2 discloses conductor track units embedded in plastic. For this purpose, conductor tracks are injection molded in plastic. The plastic contains windows, allowing electric contacting of the conductor track foil.

Document EP 1 527 967 B1 discloses a conductor track unit, containing conductor tracks with bent-over end sections. Such bent-over end sections can be used as electrical connections protruding from an electrically insulated material. The connections can be respectively connected with electrical or electronic components.

As disclosed in DE 10 2005 049 975 A1 considerable requirements must be fulfilled by a conductor track unit used in a motor vehicle. Such conductor track units are, in case of a motor vehicle, subjected to problematic ambient conditions, in particular as regards temperature, humidity, soiling as well as mechanical impacts and vibrations. Based on this, it is the task of the invention to provide a conductor track unit able to cope with such problematic ambient conditions.

To solve the task, a conductor track unit with the features of claim 1 is provided. Advantageous designs are described in the sub claims.

The conductor track unit with the characteristics of claim 1 is provided with conductor tracks embedded at least partially in insulating material. Generally, the conductor tracks are completely encased in electrically insulating material and are therefore not accessible from the outside. Electrical connections are electrically connected to the conductor tracks. The electric connections are externally accessible so that they can be connected to electric contacts of electric or electronic components, such as switches, detectors, electronic radio components, integrated circuits, electronic chips, electronic control devices or a motor, for example by soldering. The conductor tracks and electrical connections are different components which are therefore initially independent of each other and can be produced independently of one another. This separation allows production of the especially sensitive connections from a material that is particularly well suited to meet the aforementioned requirements without having to also produce the conductor tracks from this material. As the conductor tracks are embedded in an electrically insulating material and do not have to be connected retrospectively, the requirements for the conductor tracks differ from the requirements for the electrical connections. Consequently a material or also a material strength can be selected for the electrical connections, which meet the requirements for the conductor tracks particularly well. Although the number of parts, compared to a single-part design of a conductor track and connection has been increased this has, surprisingly shown that a conductor track unit that is particularly suited to meet the above requirements can be produced with overall less manufacturing effort.

To solve this task, the conductor tracks are preferably at least predominantly or completely made from another material than the electrical connections. Depending on the respective requirements, a particularly well suited material can thus be selected. In one embodiment, the electrical connections are therefore predominantly or completely made of brass. Other electrically conducting materials such as copper or gold-coated copper are possible. In one embodiment, the conductor tracks are predominantly or completely made of particularly robust steel or iron and particularly preferred from tinplate, i.e. a thin cold-rolled steel with a tin-coated surface. The material thickness, i.e. the wall thickness of the steel is preferably at least 0.05 mm and/or not more than 0.5 mm. A steel surface is coated with a very little tin, for example with less than one gram per square meter, so for instance with at least 1 $g/m^2$ and/or not more than 5 $g/m^2$. Preferably, the tin layer is thinner than 1 µm and even more preferably thinner than 0.5 µm. The tin layer provides further protection for the conductor track against negative influences, such as corrosion. Additional corrosion protection is also offered by sheathing made from electrically insulating material.

Preferably the conductor tracks are fitted, generally press fitted or clamped in any other way to form an electrical connection with the electrical contacts. Manufacturing costs can thus be kept low. It is, however, still possible to reliably connect the conductor tracks to the contacts in such a way that the connections fulfill the aforementioned requirements. As an alternative or in addition, also other connections such as soldered connections are possible.

These connections between the conductor track and electrical connection are preferably also completely embedded in electrically insulating material which contributes further to the fact that the connections can easily meet the aforementioned requirements.

In one embodiment, the electrical connections contain projections and/or indentations contained in the electrically insulating material. This achieves a further improved secure retention of the connections so that the conductor track unit as a whole is particularly suited to meet the aforementioned requirements.

In one embodiment, the electrical connections are pushed up to a stop into recesses of the conductor tracks. This also allows installation efforts to be kept to a minimum. In this embodiment, too, the respective position of the electrical connections relative to the conductor tracks is reliably and accurately maintained.

Preferably the electrical connections include a right angle with adjacent conductor track areas. Numerous contacts can therefore generally only be connected from one side, further advantageously reducing installation efforts.

Preferably the electrically insulating material is plastic and preferably a thermoplastic polymer and particularly preferably polybutylenterephthalat (PBT) and/or another plastic reinforced by glass fibers (GF). In particular PBT-GF 20 is used, i.e. a thermoplastic polymer material containing 20% glass fiber. Such a thermoplastic material can be easily processed, keeping production efforts to a minimum. Glass fibers also advantageously contribute to the conductor track unit being particularly suited to withstand the aforementioned stresses.

The conductor tracks are preferably formed by a lead frame, further keeping production efforts to a minimum.

The conductor track unit is, in particular, part of a lock for a motor vehicle or is in another way part of a motor vehicle.

DRAWINGS

Figure 2:
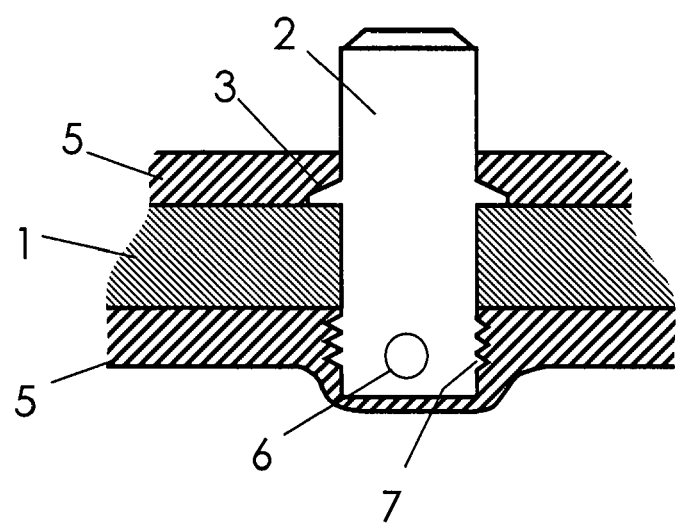
Figure 3:
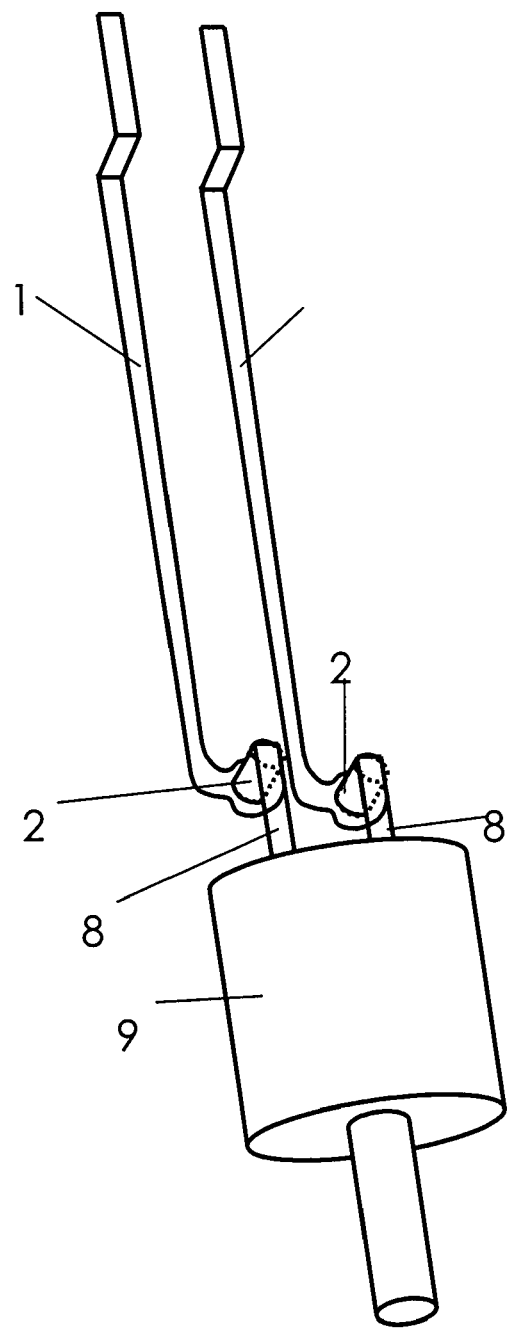
Figure 4:
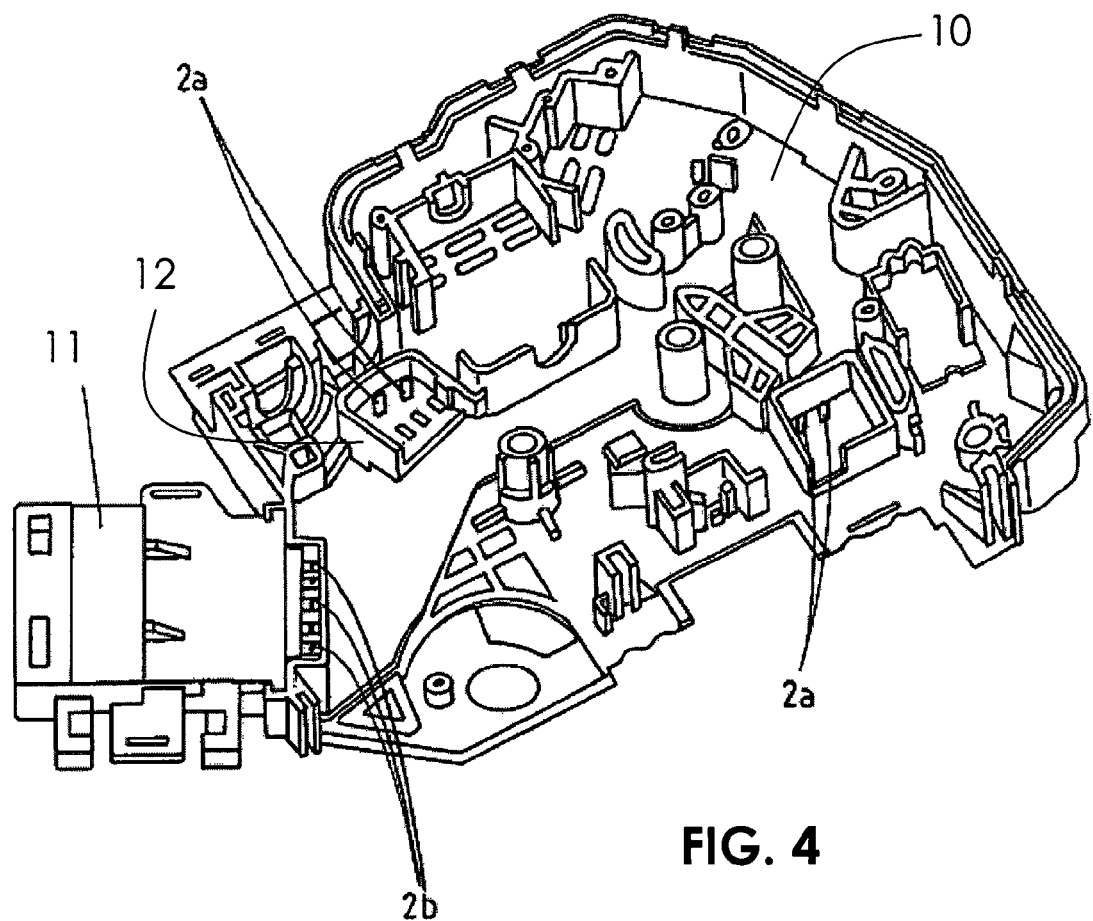

FIG. 1: shows a sectional view of a first embodiment
FIG. 2: shows a sectional view of a second embodiment
FIG. 3: shows a conductor track unit with a connected electric motor
FIG. 4: shows a lock housing section FIG. 1 shows a sectional view of, for instance a 0.3 mm thick conductor track 1, preferably made from tinplate. An electrical connection 2 extends through a hole in the conductor track 1 up to a stop 3. Connection 2 is connected to conductor track 1 by means of a press fit and is therefore in a reliable and permanent electrical contact with conductor track 1. The electrical connection 2 has a basic shape that is cylindrical and has therefore a particular mechanical stability. Such a rotationally symmetrical shape further contributes to the conductor track unit being in particular reliably able to also withstand the mechanical stresses. The optionally provide stop 3 of connection 2 surrounds the cylindrical basic shape and its cross section in one arrangement is so triangular that one side of the rectangle can rest in a co-planar manner on the surface of conductor track 1. The basic shape of the connection 2 extends through the conductor track. The end of the connection 2 extending through the track contains, for instance, a circumferential groove 4 with a, for instance, semi-circular cross section.

The conductor track 1 and the connection between contact 2 and the conductor track 1 are completely embedded in plastic 5 or are fully embedded in overmolded plastic 5. Only the end of the contact 2 shown at the top of FIG. 1 protrudes from the plastic 5 and is therefore accessible from the outside. The plastic thus contributes to protecting the connection.

Preferably, the contact 2 is made from brass and can cope particularly well with mechanical stressing due to its cylindrical shape. Other rotationally symmetrical basic shapes are, however, also possible. Rectangular or square cross sections are, also possible. Preferably the plastic is PBT which is preferably reinforced with glass fibers to not only protect the conductor track 1 against humidity and soiling but also against mechanical stresses. PBT-GF 20 or PBT-GF 30 plastics are, for instance, used.

The plastic 5 extends into the groove 4 and also covers stop 3. The plastic 5 thus contributes to the contact 2 being extremely sturdy and particularly durable. Only the area required for connecting to an electric contact of an electric or electronic component is accessible.

A conductor track unit generally contains a plurality of conductor tracks 1 and a plurality of contacts 2, which are provided, for instance, as shown in FIG. 1. The contacts are preferably provided for connecting an electric central locking drive, for instance a motor or central locking in a door or tailgate lock of a motor vehicle. When assembled, the conductor track unit is thus connected to respective contacts of an electric central locking drive, e.g. soldered, as only shown in an example in FIG. 3.

Alternatively or in addition to the semi-circular groove 4, the connection 2 can contain one or several holes 6 extending into the plastic material 5. Alternatively or in addition, the cylindrical outer surface can at least in parts contain a thread or ribbing 7 as shown in FIG. 2, extending into the plastic material to ensure a reliable retention.

The sectional view of the stop 3 does not have to be triangular. The outer edge can, for instance, be flattened or can for example be replaced by a vertical wall, as shown in FIG. 2.

Also other forms of indentations, recesses, notching or protruding offsets are possible to ensure a good retention in the plastic material.

The invention provides a particularly robust but at the same time delicate conductor rail unit.

FIG. 3 shows two conductor rails 1 of a lead frame. The conductor rails 1 are not embedded in plastic in FIG. 3 in order to provide an unimpeded view of the conductor tracks 1. Two electrical connections 2 are securely connected to the end sections of the conductor tracks 1 by individual press fitting to the conductor rails 1. Electrical contacts 8 of an electric motor 9 are soldered to the connections 2. The electric motor 9 is, in particular, part of a central locking. Instead of an electric motor also an actuator can be provided, able to move a bolt to and fro between two different positions. Such an actuator can also be part of the lock for a motor vehicle.

FIG. 4 shows the inside of a lock housing part 10 with conductor tracks inserted from the outside, which are provided in form of a lead frame. On the outside, the conductor tracks and the connections between the conductor tracks and the connections are, in particular, completely embedded in an electrically insulating material. The electrical connections of the conductor tracks of the conductor track unit of the invention extend through openings in the lock housing part 10 so that the end sections 2a, 2b of the electrical connections of the conductor unit are arranged inside the lock housing part 10, as shown. Where required, these ends 2a, 2b are connected to respective electrical, electromechanical or electronic components. The ends 2b of connections which are electrically connected by press fitting to the conductor tracks contained at the rear of the lock housing section 10—not shown—extend close to the respective housing edge through the adjacent wall, in order to be suitably connected using a connector plug 11. Ends 2a and 2b are, in particular, soldered to electrical connections of connectors and other electrical, electromechanical or electronic components in order to provide reliable electrical connections. The areas accommodating electrical or electronic components which are, for instance, restricted by walls 12 extending perpendicularly from the rear wall, can be covered by an electrically insulating compound, to also protect the electrical connections against external influences. Instead of a casting compound also an insulating material can be pushed into said areas. Perpendicular walls 12 achieve that an insulating compound can be quickly and reliably cast into a specified area, in order to obtain the desired screening. Similarly, the rear of the conductor tracks can be protected against external influences. Casting also provides a mechanical fixation. The conductor tracks can, however, also be inserted in a housing part 10 and embedded in a casting compound.

Instead of a casting compound also a suitable insulating material can, for instance be pressed into the area or form. Without any major technical effort, a lock housing part 10 can thus be provided with electrical connections and electrical lines that are permanently and electrically screened from the outside. The described housing part 10 can be produced as a single part by injection molding and is therefore preferably made of a suitable thermoplastic compound, such as PE.

After installation of the desired components and parts, the lock housing part 10 can be closed off by a further lock housing part or a plate, to thus provide the desired lock for a motor vehicle. This component, electrically connected by ends 2a, is, in particular, an electric motor of a central locking of the lock.

Not all electrical connections of such a conductor track unit of the invention have to be designed in the inventive manner. An inventive conductor track unit can thus, in addition to the inventive connections, also contain other connections connected as a single piece with the conductor tracks. Such single-piece connections can be provided in form of bent-over end sections. Depending on the stresses to be withstood once installed, connections are therefore provided as a single-piece design or as the inventive two-piece design.

REFERENCE NUMERALS

1: Conductor track
2: Electrical connections
2a, 2b: Electrical connecting end
3: Stop
4: Groove
5: Plastic sheathing
6: Hole
7: Ribbing
8: Contact of an electric motor
9: Electric motor
10: Lock housing part
11: Connector
12: Wall This invention claimed is:

1. Conductor track unit provided with conductor tracks embedded in an electrically insulating material and externally accessible electrical contacts extending through the conductor tracks to be retained in the electrically insulating material and electrically connected to the conductor tracks, wherein the conductor tracks and the electrical contacts are different components and each of the electrical contacts has at least one protrusion extending into the electrically insulating material for retention of the electrical contact.

2. Conductor track unit according to claim 1, wherein the conductor tracks are at least predominantly made of a different material than the electrical contacts.

3. Conductor track unit according to claim 1, wherein the electrical contacts are predominantly or completely made of brass and/or that the conductor tracks are predominantly or completely made of steel, iron or tinplate.

4. Conductor track unit according to claim 1, wherein the conductor tracks are electrically connected to the electrical contacts by press fitting and/or by clamping.

5. Conductor track unit according to claim 1, wherein the electrical contacts contain projections, grooves, ribbing and/or indentations abutting the electrically insulating material.

6. Conductor track unit according to claim 1, wherein the electrical contacts have been inserted into recesses or holes in the conductor tracks up to a stop of the electrical contact.

7. Conductor track unit according to claim 1, wherein the electrical contacts include a right angle with adjacent conductor rail sections.

8. Conductor track unit according to claim 1, wherein the electrically insulating material is made of plastic and preferably of a thermoplastic compound and particularly preferably of polybutylenterephthalat (PBT) and/or a plastic reinforced with glass fiber.

9. Conductor track unit according to claim 1, wherein the conductor tracks are a lead frame.

10. Lock for a motor vehicle with a conductor rail unit according to claim 1, in which the conductor rail unit is, in particular, connected to the electric motor of a central locking.

* * * * *